US011690205B1

United States Patent
Wang et al.

(10) Patent No.: US 11,690,205 B1
(45) Date of Patent: Jun. 27, 2023

(54) ELECTRONIC DISPLAY ASSEMBLY

(71) Applicant: DYNASCAN TECHNOLOGY CORP., Taoyuan (TW)

(72) Inventors: Tsun-I Wang, Taoyuan (TW); Ching-Chun Wu, Taoyuan (TW); Chia-Liang Yang, Taoyuan (TW); Chin Liang Wang, Taoyuan (TW)

(73) Assignee: DYNASCAN TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 17/669,723

(22) Filed: Feb. 11, 2022

(51) Int. Cl.
| | |
|---|---|
| *H05K 7/00* | (2006.01) |
| *H05K 5/00* | (2006.01) |
| *G06F 1/16* | (2006.01) |
| *H05K 7/20* | (2006.01) |

(52) U.S. Cl.
CPC ......... *H05K 7/20972* (2013.01); *H05K 7/202* (2013.01)

(58) Field of Classification Search
CPC ............... H05K 7/20972; H05K 7/202; H05K 7/20963; H05K 7/20954; H05K 7/20981; H05K 7/2099; H05K 7/20009
See application file for complete search history.

(56) References Cited

U.S. PATENT DOCUMENTS

| | | | | |
|---|---|---|---|---|
| 9,470,924 B2 * | 10/2016 | Dunn | ................. | H05K 7/20972 |
| 9,797,588 B2 * | 10/2017 | Dunn | ................. | G02F 1/133603 |
| 9,835,893 B2 * | 12/2017 | Dunn | ................. | G02F 1/133603 |
| 9,894,800 B2 * | 2/2018 | Dunn | ................. | H05K 7/20154 |
| 10,088,702 B2 * | 10/2018 | Dunn | ................. | G02F 1/133382 |
| 10,114,434 B2 * | 10/2018 | Wang | ................. | F28D 15/06 |
| 10,314,212 B2 * | 6/2019 | Hubbard | ........... | G02F 1/133308 |
| 10,359,659 B2 * | 7/2019 | Dunn | ................. | H05K 7/20972 |
| 10,524,397 B2 * | 12/2019 | Dunn | ................. | H05K 7/202 |
| 10,559,965 B2 * | 2/2020 | Dunn | ................. | H02J 7/0013 |
| 10,660,245 B2 * | 5/2020 | Dunn | ................. | H05K 7/20972 |
| 10,820,445 B2 * | 10/2020 | Diaz | ................. | B60R 11/0229 |
| 10,827,656 B2 * | 11/2020 | Hubbard | ........... | H05K 7/20145 |

* cited by examiner

*Primary Examiner* — Anthony M Haughton
(74) *Attorney, Agent, or Firm* — Duane Morris LLP

(57) ABSTRACT

The present disclosure provides a display. The display includes a display module, a supporting plate, and an evaporator. The display module has a front surface and a rear surface opposite the front surface of the display module. The supporting plate is attached to the rear surface of the display module. The evaporator is attached to the supporting plate and thermally connected to the rear surface of the display module through the supporting plate.

22 Claims, 3 Drawing Sheets

ELECTRONIC DISPLAY ASSEMBLY

BACKGROUND

1. Technical Field

The present disclosure generally relates to an electronic display assembly.

2. Description of the Related Art

A cooling system may be employed in a display apparatus to prevent overheating. Conventionally, a cooling system may include an evaporator for cooling the air and a fan for circulating the cooled air. Such a cooling system may be bulky and effectiveness thereof may need to be improved upon.

In addition, the circulating loop of the cooling system is often airtight to prevent incursion of dust and other contaminants. However, heat and moisture may accumulate over time and the reliability of the display apparatus degraded thereby.

SUMMARY

In one or more embodiments, the present disclosure provides an electronic display assembly. The electronic display assembly includes a case, a first display module disposed on a first side of the case, and a first heat exchanger in the case and thermally connected to the first display module. The first heat exchanger includes a first channel and a second channel. The first channel and the first display module define a first internal heat exchange loop and the second channel defines at least a part of a first external heat dissipation path. The electronic display assembly also includes a second display module disposed on a second side opposite to the first side of the case and a second heat exchanger in the case and thermally connected to the second display module. The second heat exchanger includes a third channel and a fourth channel. The third channel and the second display module define a second internal heat exchange loop and the fourth channel defines at least a part of a second external heat dissipation path. The electronic display assembly also includes a first sealing component arranged at a periphery of the first display module and a first transparent lid disposed on the first side of the case for covering the first display module. The first transparent lid is removably attached to the first sealing component. The electronic display assembly also includes a second sealing component arranged at a periphery of the second display module and a second transparent lid disposed on the second side of the case for covering the second display module. The second transparent lid is removably attached to the second sealing component.

In one or more embodiments, the present disclosure provides an electronic display assembly. The electronic display assembly includes a case, a first display module disposed on a first side of the case, and a first heat exchanger fixed in the case and thermally connected to the first display module. The first heat exchanger is configured to function as a first supporting board directly contacting the first display module. The first heat exchanger includes a first channel and a second channel. The first channel and the first display module define a first internal heat exchange loop and the second channel defines at least a part of a first external heat dissipation path. The electronic display assembly also includes a second display module disposed on a second side opposite to the first side of the case and a second heat exchanger fixed in the case and thermally connected to the second display module. The second heat exchanger is configured to function as a second supporting board directly contacting the second display module. The second heat exchanger includes a third channel and a fourth channel. The third channel and the second display module define a second internal heat exchange loop and the fourth channel defines at least a part of a second external heat dissipation path. The electronic display assembly also includes a first transparent lid for covering the first display module and a second transparent lid for covering the second display module. The first transparent lid is disposed on the first side of the case and rotatably connected to the case. The second transparent lid is disposed on the second side of the case and rotatably connected to the case.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
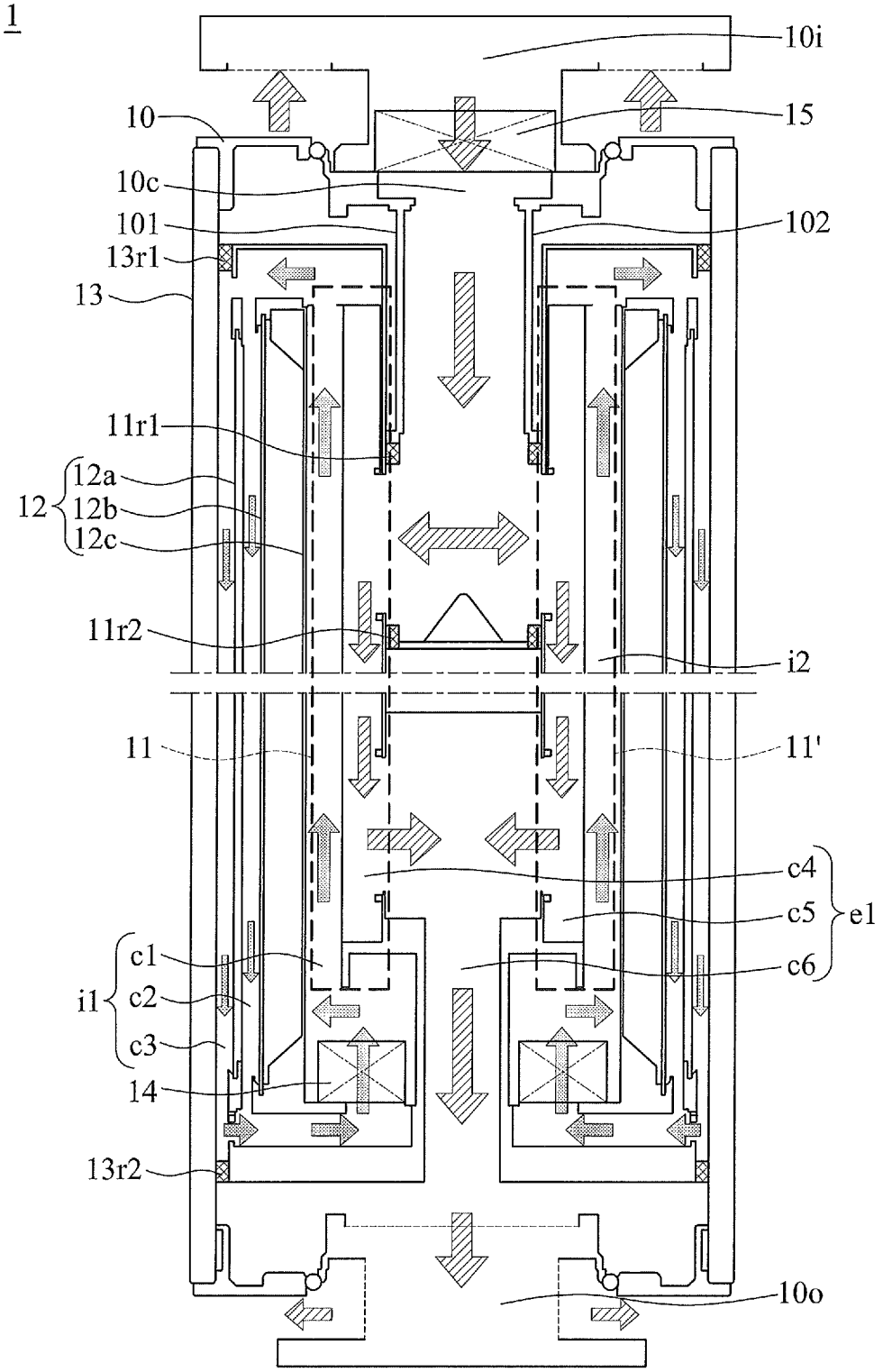
FIG. 1 is a cross-section of an exemplary electronic display assembly, in accordance with an embodiment of the present disclosure.

The following disclosure provides many different embodiments, or examples, for implementing different features of the provided subject matter. Specific examples of components and arrangements are described herein. These are, of course, merely examples and are not intended to be limiting. The present disclosure may repeat reference numerals and/or letters in the various examples. This repetition is for simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-section of an exemplary electronic display assembly 1, in accordance with an embodiment of the present disclosure. In some embodiments, the electronic display assembly 1 may include a case 10, a heat exchanger 11, a display module 12, a transparent lid 13, an internal flow generator 14, and an external flow generator 15.

The case (or a housing) 10 may have an inlet 10$i$, an outlet 10$o$ opposite to the inlet 10$i$, and a central portion 10$c$ connecting the inlet 10*i* and the outlet 10*o*. The central portion 10*c* may include or define a central path c6 connecting or fluidly conducting to the external environment through the inlet 10*i* and the outlet 10*o*. For example, external or ambient airflow may enter the central portion 10*c* through the inlet 10*i* and exit the central portion 10*c* through the outlet 10*o*.

The central portion 10*c* of the case 10 may have a side 101 and a side 102 opposite to the side 101. A space may be respectively defined on the side 101 and on the side 102.

For example, the transparent lid 13 and the case 10 may define a space on the side 101 for accommodating a set of components including but not limited to the heat exchanger 11, the display module 12, and the internal flow generator 14. Similarly, another transparent lid and the case 10 may define a space on the side 102 for accommodating another heat exchanger, another display module, and another internal flow generator. The electronic display assembly 1 may include a double-sided display. Since the components on both sides are similar, only the components on side 101 are annotated with reference numbers in the figures and described in detail for conciseness and clarity.

The heat exchanger 11 may be disposed in the space defined by the case 10 on the side 101. In some embodiments, the heat exchanger 11 may be attached or fixed to the case 10. In some embodiments, the heat exchanger 11 may be attached to the case 10 through one or more sealing components 11*r*1 and 11*r*2. In some embodiments, the sealing components 11*r*1 and 11*r*2 may include rubber gaskets or O-rings. In some embodiments, the sealing components 11*r*1 and 11*r*2 may be disposed between the central portion 10*c* and the heat exchanger 11.

In some embodiments, the heat exchanger 11 may be configured to function as a supporting board for the display module 12. For example, the heat exchanger 11 may provide mechanical support for the display module 12. For example, the heat exchanger 11 may directly contact the display module 12 (such as a backlight layer 12*c* of the display module 12). For example, the display module 12 may have a front side configured to emit a light and a rear side directly contacting the heat exchanger 11.

For large-sized display apparatus, the supporting board may increase the thickness and weight of the display apparatus significantly. Furthermore, a supporting board disposed between the display module and the heat exchanger may also reduce the efficiency of heat dissipation. By providing a heat exchanger 11 which also functions as a supporting board, the thickness and weight of the display apparatus can be reduced, and the heat dissipation efficiency can be improved as well.

In some embodiments, the heat exchanger 11 may be thermally connected to the display module 12 and the case 10 (such as the central portion 10*c*). In some embodiments, the heat exchanger 11 may be integrally formed or one-piece formed. In some embodiments, the heat exchanger 11 may include an aluminum extrusion (such as an aluminum t-slot extrusion). In some embodiments, the heat exchanger 11 may include a plurality of channels or cells. For example, the heat exchanger 11 may include a channel c1 and a channel c4.

The channel c1 may be adjacent to and thermally connected to the display module 12. The channel c1 may connect or fluidly conduct to a channel c2 and a channel c3 (detailed as follows). The channel c1, the channel c2, and the channel c3 may define an internal heat exchange loop i1.

The channel c4 may be adjacent to and thermally connected to the channel c1. The channel c4 may be adjacent to and thermally connected to the central portion 10*c*. The channel c4 may connect or fluidly conduct to the central path c6 of the central portion 10*c*. The channel c4, the central path c6, and a channel c5 of another heat exchanger on the side 102 may define an external heat dissipation path e1. In some embodiments, the external heat dissipation path e1 may be configured to dissipate heat from the channel c1. In some embodiments, the flow direction of the channel c1 may be opposite to the flow direction of the channel c4.

The display module 12 may be disposed in the space defined by the case 10 on the side 101. In some embodiments, the display module 12 may include a display panel 12*a*, an optical film 12*b*, and the backlight layer 12*c*. The display panel 12*a* may be disposed between the optical film 12*b* and the transparent lid 13. The optical film 12*b* may be disposed between the display panel 12*a* and the backlight layer 12*c*. The backlight layer 12*c* may be disposed between the optical film 12*b* and the heat exchanger 11.

The display panel 12*a* may include, for example, a glass panel, a liquid crystal panel, a plastic panel, or other. The optical film 12*b* may include, for example, a diffuser, a reflector, a polarizer, a filter, a light guiding element, a lens, or other optical elements. The backlight layer 12*c* may include a plurality of light emitting pixels.

In some embodiments, the display module 12 may include the channel c2 between the display panel 12*a* and the optical film 12*b*.

The transparent lid 13 may be disposed on the side 101 of the case 10. The transparent lid 13 may be rotatably connected to the case 10 through a pivot joint 11p. The transparent lid 13 may be removably attached to the case 10 through one or more sealing components 13*r*1 and 13*r*2. In some embodiments, the sealing components 13*r*1 and 13*r*2 may include rubber gaskets or O-rings. In some embodiments, the sealing components 13*r*1 and 13*r*2 may be disposed between the transparent lid 13 and the case 10. In some embodiments, the sealing components 13*r*1 and 13*r*2 may be disposed between the transparent lid 13 and the display module 12. In some embodiments, the sealing components 13*r*1 and 13*r*2 may be arranged at a periphery of the display module 12.

In some embodiments, the transparent lid 13 may be configured to cover the display module 12. In some embodiments, the transparent lid 13 and the display panel 12*a* of the display module 12 may define the channel c3. For example, the channel c3 may be defined between the transparent lid 13 and the display panel 12*a*.

In some embodiments, the electronic display assembly 1 may include the internal heat exchange loop i1 on the side 101. As described, the internal heat exchange loop i1 may be defined by one or more channels on the side 101, such as the channel c1, the channel c2, and the channel c3. The internal heat exchange loop i1 may be configured to cool the components on the side 101. In some embodiments, the internal heat exchange loop i1 may be isolated from the external environment. For example, the external airflow may not enter the internal heat exchange loop i1.

The internal flow generator 14 may be disposed in the space defined by the case 10 on the side 101. In some embodiments, the internal flow generator 14 may be disposed adjacent to the channel c1. In some embodiments, the internal flow generator 14 may connect or fluidly conduct to the channel c1, channel c2, and channel c3. In some embodiments, the internal flow generator 14 may include a fan. In some embodiments, the internal flow generator 14 may be configured to generate an internal airflow through the internal heat exchange loop i1.

Similarly, the electronic display assembly 1 may include an internal heat exchange loop i2 on the side 102. The internal heat exchange loop i2 may be defined by one or more channels on the side 102. The internal heat exchange loop i2 may be configured to cool the components on the side 102. In some embodiments, the internal heat exchange loop i2 may be isolated from the external environment. For example, the external airflow may not enter the internal heat exchange loop i2.

In some embodiments, the internal heat exchange loop i2 may be isolated from the internal heat exchange loop i1. For example, the internal heat exchange loop i2 may be separated or independent from the internal heat exchange loop i1. For example, the internal heat exchange loop i2 may not connect or fluidly conduct to the internal heat exchange loop i1. In these cases, the pollution from the external environment, such as dust or moisture, would not enter the space accommodating the display module 12 and other electrical components, so as to retard the ageing of the components in the space.

In some embodiments, the electronic display assembly 1 may include the external heat dissipating path e1. As described, the external heat dissipating path e1 may be defined by the channel c4 of the heat exchanger 11 on the side 101, the channel c5 of another heat exchanger on the side 102, and the central path c6. The channel c4 and the channel c5 may each be connected between the inlet 10*i* and the out let 10*o* through the central path c6. The channel c4 and the channel c5 may connect or fluidly conduct to the external environment through the central path c6, the inlet 10*i* and the outlet 10*o*.

The external heat dissipating path e1 may be configured to conduct heat from the internal heat exchange loop i1 and the internal heat exchange loop i2 to the external environment. For example, the external heat dissipating path e1 may be shared between the internal heat exchange loop i1 and the internal heat exchange loop i2.

In some embodiments, the external heat dissipating path e1 may be isolated from the internal heat exchange loop i1 and the internal heat exchange loop i2. For example, the external heat dissipating path e1 may be separated or independent from the internal heat exchange loop i1 and the internal heat exchange loop i2. For example, the external heat dissipating path e1 may not connect or fluidly conduct to the internal heat exchange loop i1 and the internal heat exchange loop i2.

The external flow generator 15 may be disposed adjacent to the central portion 10*c* of the case 10. The external flow generator 15 may connect or fluidly conduct to the channel c4, the channel c5, and the central path c6. In some embodiments, the external flow generator 15 may include a fan. In some embodiments, the external flow generator 15 may be configured to generate an external airflow through the external heat dissipation path e1.

According to some embodiments of the present disclosure, since heat from the internal heat exchange loop i1 and the internal heat exchange loop i2 can be dissipated through a singular path (i.e., the central path c6), the size of the electronic display assembly 1 is reduced.

In addition, only one external flow generator 15 is needed and the display modules of the electronic display assembly 1 on both sides can be cooled at the same time. The wind pressure caused by the external flow generator 15 is distributed to both channels c4 and c5. Thus, the wind pressure in either channel c4 or channel c5 is lower than if the wind pressure caused by the external flow generator 15 is applied to only one channel.

Generally, the heat dissipation efficiency can be raised by increasing the rotational speed of the flow generator. In that case, the wind pressure and the noise caused by the wind pressure increase as well. According to some embodiments of the present disclosure, the wind pressure in channel c4 or c5 is lower than if only one channel is connected the external flow generator 15. As a result, the noise caused by the wind pressure is eliminated while the heat dissipation efficiency of the electronic display assembly 1 remains unchanged.

Figure 2:
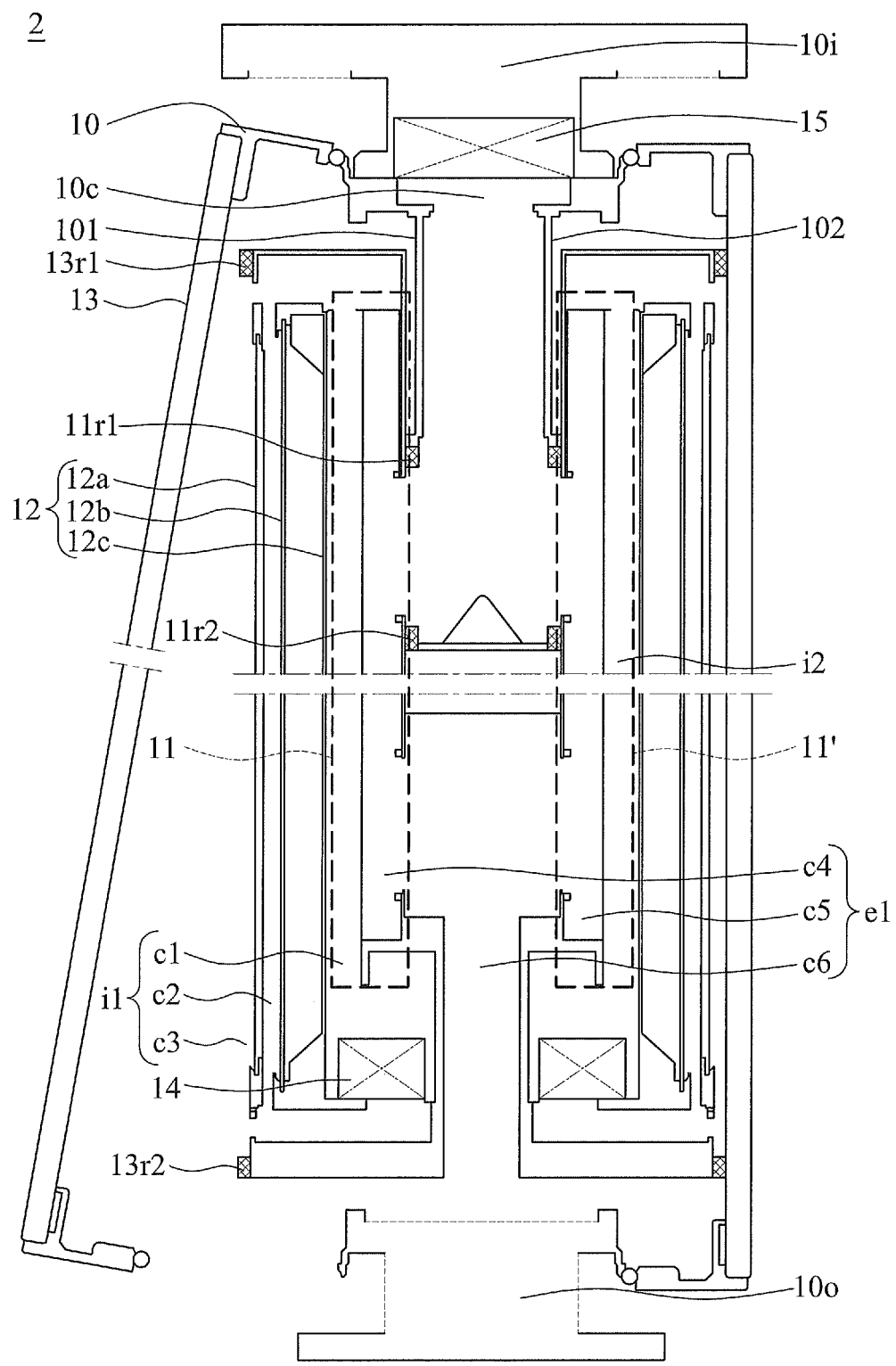
FIG. 2 shows the exemplary electronic display assembly of FIG. 1 with a transparent lid exposing an internal heat exchange loop to the environment, in accordance with an embodiment of the present disclosure.

FIG. 2 shows the exemplary electronic display assembly 1 of FIG. 1 with a transparent lid 13 exposing the internal heat exchange loop i1 to the environment, in accordance with an embodiment of the present disclosure.

In some embodiments, as shown in FIG. 1, when the transparent lid 13 is closed (or at a first location), the transparent lid 13 may be attached to the case 10 through the sealing components 13*r*1 and 13*r*2. The transparent lid 13 and the sealing components 13*r*1 and 13*r*2 may isolate the internal space (such as the internal heat exchange loop i1) of the case 10 from the external environment (such as air). For example, the transparent lid 13 and the sealing components 13*r*1 and 13*r*2 may define an airtight space.

In some embodiments, as shown in FIG. 2, when the transparent lid 13 is opened (or at a second location), the internal space (such as the internal heat exchange loop i1) of the case 10 may be exposed to the external environment (such as air).

According to some embodiments of the present disclosure, since the transparent lid 13 may be closed or opened, the internal space of the case 10 may be cleaned and maintain as needed. Therefore, the reliability of the electronic display assembly 1 can be enhanced.

Figure 3:
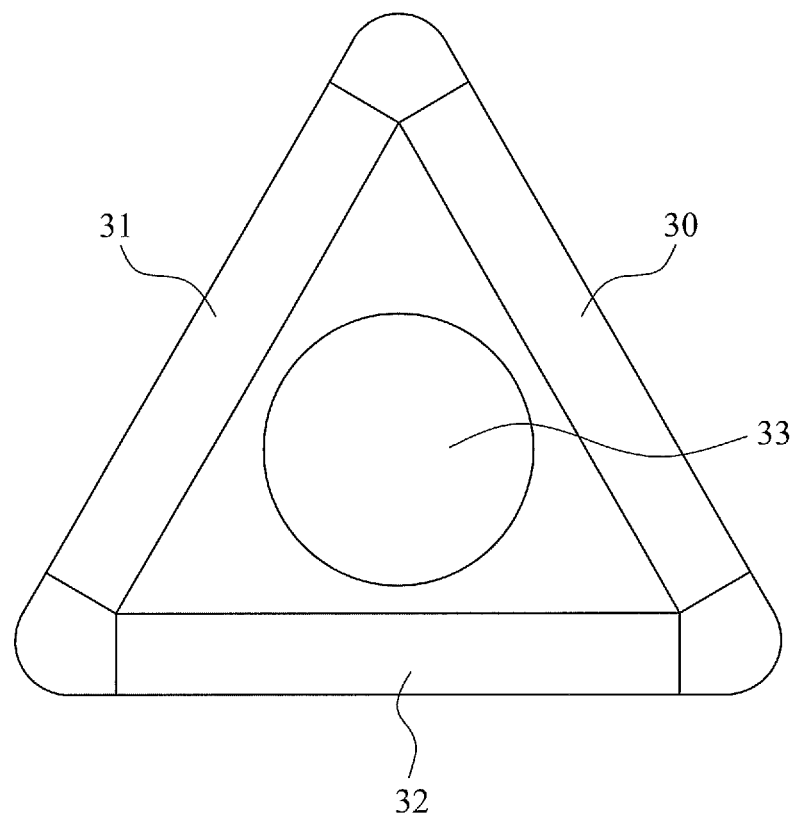
FIG. 3 is a top view of an exemplary electronic display assembly, in accordance with an embodiment of the present disclosure.

FIG. 3 is a top view of an exemplary electronic display assembly 3, in accordance with an embodiment of the present disclosure.

The electronic display assembly 3 may include a three-sided display. For example, the electronic display assembly 3 may include a central portion 33 and display modules 30, 31, and 32. The display modules 30, 31, and 32 may be arranged on three sides of the central portion 33. The display modules 30, 31, and 32 may be arranged around the central portion 33.

The display modules 30, 31, and 32 may each be similar to the display module 12 in FIG. 1. The electronic display assembly 3 may include other components including but not limited to, a transparent lid, a heat exchanger, and an internal flow generator respectively on the three sides of central portion 33. The other components are not shown in FIG. 3 for conciseness and clarity.

The electronic display assembly 3 may also include an external flow generator disposed adjacent to the central portion 33. Heat from the display modules 30, 31, and 32 may be dissipated through an external heat dissipating path defined by the central portion 33.

The number of the display modules may be determined based on the size and the dissipation efficiency of the electronic display assembly 3 (or other design requirements) and are not limited to this embodiment.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. An electronic display assembly, comprising:
   a case;
   a first display module disposed on a first side of the case;
   a first heat exchanger in the case and thermally connected to the first display module, the first heat exchanger comprising a first channel and a second channel, wherein the first channel and the first display module define a first internal heat exchange loop and the second channel defines at least a part of a first external heat dissipation path;
   a second display module disposed on a second side opposite to the first side of the case;
   a second heat exchanger in the case and thermally connected to the second display module, the second heat exchanger comprising a third channel and a fourth channel, wherein the third channel and the second display module define a second internal heat exchange loop and the fourth channel defines at least a part of a second external heat dissipation path;
   a first sealing component arranged at a periphery of the first display module;
   a first transparent lid, disposed on the first side of the case and removably attached to the first sealing component, for covering the first display module;
   a second sealing component arranged at a periphery of the second display module;
   a second transparent lid, disposed on the second side of the case and removably attached to the second sealing component, for covering the second display module.

2. The electronic display assembly of claim 1, wherein the first transparent lid is rotatably connected to the case through a first pivot joint.

3. The electronic display assembly of claim 2, wherein second transparent lid is rotatably connected to the case through a second pivot joint.

4. The electronic display assembly of claim 2, wherein the first transparent lid includes a first location and a second location with respect to the case, wherein the first transparent lid at the first location and the first sealing component seal the first internal heat exchange loop in the case and isolate the first internal heat exchange loop from air, and wherein the first transparent lid at the second location exposes the first internal heat exchange loop to air.

5. The electronic display assembly of claim 4, wherein the second transparent lid includes a first location and a second location with respect to the case, wherein the second transparent lid at the first location and the second sealing component seal the second internal heat exchange loop in the case and isolate the second internal heat exchange loop from air, and wherein the second transparent lid at the second location exposes the second internal heat exchange loop to air.

6. The electronic display assembly of claim 1, wherein the first internal heat exchange loop is isolated from the second internal heat exchange loop.

7. The electronic display assembly of claim 1, wherein the first internal heat exchange loop is isolated from the first external heat dissipation path and wherein the second internal heat exchange loop is isolated from the second external heat dissipation path.

8. The electronic display assembly of claim 1, wherein each of the first external heat dissipation path and the second external heat dissipation path is connected between an inlet and an outlet of the case.

9. The electronic display assembly of claim 8, further comprising a central path connecting with the first external heat dissipation path and the second external heat dissipation path.

10. The electronic display assembly of claim 1, further comprising a first internal flow generator disposed in adjacent to the first channel and a second internal flow generator disposed in adjacent to the third channel.

11. The electronic display assembly of claim 1, further comprising an external flow generator fluidly conducting to the first external heat dissipation path and the second external heat dissipation path.

12. The electronic display assembly of claim 1, wherein the first heat exchanger is fixed to the case and configured to function as a first supporting board directly contacting the first display module.

13. The electronic display assembly of claim 12, wherein the second heat exchanger is fixed to the case and configured to function as a second supporting board directly contacting the second display module.

14. An electronic display assembly, comprising:
   a case;
   a first display module disposed on a first side of the case;
   a first heat exchanger fixed in the case and thermally connected to the first display module, wherein the first heat exchanger is configured to function as a first supporting board directly contacting the first display module, wherein the first heat exchanger comprising a first channel and a second channel, and wherein the first channel and the first display module define a first internal heat exchange loop and the second channel defines at least a part of a first external heat dissipation path;
   a second display module disposed on a second side opposite to the first side of the case;

a second heat exchanger fixed in the case and thermally connected to the second display module, wherein the second heat exchanger is configured to function as a second supporting board directly contacting the second display module, wherein the second heat exchanger comprising a third channel and a fourth channel, and wherein the third channel and the second display module define a second internal heat exchange loop and the fourth channel defines at least a part of a second external heat dissipation path;

a first transparent lid, disposed on the first side of the case and rotatably connected to the case, for covering the first display module;

a second transparent lid, disposed on the second side of the case and rotatably connected to the case, for covering the second display module.

15. The electronic display assembly of claim 14, wherein the first transparent lid includes a first location and a second location with respect to the case, wherein the first transparent lid at the first location seals the first internal heat exchange loop in the case and isolate the first internal heat exchange loop from air, and wherein the first transparent lid at the second location exposes the first internal heat exchange loop to air.

16. The electronic display assembly of claim 15, wherein the second transparent lid includes a first location and a second location with respect to the case, wherein the second transparent lid at the first location seals the second internal heat exchange loop in the case and isolate the second internal heat exchange loop from air, and wherein the second transparent lid at the second location exposes the second internal heat exchange loop to air.

17. The electronic display assembly of claim 14, wherein the first internal heat exchange loop is isolated from the second internal heat exchange loop.

18. The electronic display assembly of claim 14, wherein the first internal heat exchange loop is isolated from the first external heat dissipation path and wherein the second internal heat exchange loop is isolated from the second external heat dissipation path.

19. The electronic display assembly of claim 14, wherein each of the first external heat dissipation path and the second external heat dissipation path is connected between an inlet and an outlet of the case.

20. The electronic display assembly of claim 19, further comprising a central path connecting with the first external heat dissipation path and the second external heat dissipation path.

21. The electronic display assembly of claim 14, further comprising a first internal flow generator disposed in adjacent to the first channel and a second internal flow generator disposed in adjacent to the third channel.

22. The electronic display assembly of claim 14, further comprising an external flow generator fluidly conducting to the first external heat dissipation path and the second external heat dissipation path.

* * * * *